US011506698B2

(12) United States Patent
Yin et al.

(10) Patent No.: US 11,506,698 B2
(45) Date of Patent: Nov. 22, 2022

(54) SYSTEM AND METHOD FOR ELECTROSTATIC ALIGNMENT AND SURFACE ASSEMBLY OF PHOTONIC CRYSTALS FOR DYNAMIC COLOR EXHIBITION

(71) Applicant: THE REGENTS OF THE UNIVERSITY OF CALIFORNIA, Oakland, CA (US)

(72) Inventors: Yadong Yin, Riverside, CA (US); R. Andrew Davidson, Riverside, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 222 days.

(21) Appl. No.: 16/791,244

(22) Filed: Feb. 14, 2020

(65) Prior Publication Data

US 2020/0264224 A1    Aug. 20, 2020

Related U.S. Application Data

(60) Provisional application No. 62/807,000, filed on Feb. 18, 2019.

(51) Int. Cl.
*G01R 29/24* (2006.01)
*G01R 29/14* (2006.01)
*G02B 1/00* (2006.01)

(52) U.S. Cl.
CPC ............. *G01R 29/24* (2013.01); *G01R 29/14* (2013.01); *G02B 1/005* (2013.01); *G02B 2207/101* (2013.01)

(58) Field of Classification Search
CPC ........ G01R 29/00; G01R 29/12; G01R 29/14; G01R 29/24; G02B 1/00; G02B 1/002;
(Continued)

(56) References Cited

U.S. PATENT DOCUMENTS 3,516,941 A    6/1970  Matson
8,501,432 B2    8/2013  Ryan et al.
(Continued)

FOREIGN PATENT DOCUMENTS

CN    102822085 A    12/2012
CN    104950480 A    9/2015
WO    95/11126 A1    4/1995

OTHER PUBLICATIONS

Notification of Transmittal of the International Search Report (Form PCT/ISA/220 and PCT/ISA/210) and the Written Opinion of the International Searching Authority (Form PCT/ISA/237) dated May 12, 2020, by the ISA/US Commissioner for Patent in corresponding International Application No. PCT/US2020/018239. (14 pages).
(Continued)

*Primary Examiner* — Hoai-An D. Nguyen
(74) *Attorney, Agent, or Firm* — Buchanan Ingersoll & Rooney PC

(57) ABSTRACT

A system and method are disclosed of electrostatic alignment and surface assembly of photonic crystals for dynamic color exhibition. The method includes: dispersing a plurality of photonic crystal chains into a solution; placing the solution of the plurality of photonic crystal chains in a container; and assembling and aligning the plurality of photonic crystal chains in the solution by a local charge build up on a surface of the container to exhibit color.

30 Claims, 2 Drawing Sheets

(58) Field of Classification Search
CPC ............... G02B 1/005; G02B 2207/00; G02B 2207/101; C30B 29/00; C30B 29/10; C30B 29/16; C30B 29/60; C30B 30/00; C30B 30/02
USPC ........................................................ 324/457
See application file for complete search history.

(56) References Cited

U.S. PATENT DOCUMENTS

| | | | |
|---|---|---|---|
| 9,069,307 | B2 | 6/2015 | Ruiz et al. |
| 9,625,784 | B2 | 4/2017 | Joo |
| 2012/0061609 | A1 | 3/2012 | Yin et al. |
| 2014/0124369 | A1* | 5/2014 | Han ................. C09D 4/00 204/478 |
| 2015/0022877 | A1* | 1/2015 | Cha .................. G02F 1/21 252/500 |
| 2015/0266246 | A1 | 9/2015 | Lussier |
| 2017/0139304 | A1* | 5/2017 | Wang ............... G02F 1/1685 |

OTHER PUBLICATIONS

Office Action (First Office Action) dated Aug. 10, 2022, by the National Intellectual Property Administration, P. R. China in corresponding Chinese Patent Application No. 202080029184.8 and an English Translation of the Office Action. (18 pages).

* cited by examiner

SYSTEM AND METHOD FOR ELECTROSTATIC ALIGNMENT AND SURFACE ASSEMBLY OF PHOTONIC CRYSTALS FOR DYNAMIC COLOR EXHIBITION

CROSS REFERENCE TO RELATED APPLICATIONS

This application claims the benefit of U.S. Provisional Application 62/807,000, filed Feb. 18, 2019, which is incorporated by reference in its entirety.

FIELD OF THE INVENTION

The present disclosure generally relates to a method and system for electrostatic alignment and surface assembly of photonic crystals for dynamic color exhibition.

BACKGROUND OF THE INVENTION

Photonic crystals are a class of materials that possess structural color properties and exhibit different colors when geometrically aligned and orientated. Commonly, self-assembled layers of spherical particles form three-dimensional (3D) structures, which diffract light to exhibit color. Due to the mechanism of producing color by photonic crystals, the photonic crystals are inherently angularly dependent and therefore it is important to control the structure and geometry of the photonic crystals.

Controlling the exhibited color of photonic crystals has been completed in two ways. The first and most common method is to change the size of the particles or voids, which are responsible for diffraction. This is often demonstrated through manipulation of the chemical environment of the photonic crystal such that the crystal swells or shrinks and thus exhibits various colors. Applications of this mechanism often fall under a broad category of chemical sensors. Though chemical sensing is important, the same mechanism has limited applicability due to the same chemical sensitivity of the photonic crystals.

More recent advances in control over photonic crystal geometries focus around using remote energies such as magnetic fields to arrange and manipulate the photonic crystal structures. The ability to manipulate the color of the photonic crystal without changing the chemical environment expands the range of the applications photonic crystals may be used.

Manipulating materials with magnetic fields is one example of remote control, but infrastructure to accomplish efficient magnetic control on a scaled down device such as a microdevice is limited in scope. Electric fields, however, have been developed far more substantially providing more infrastructure support to new electric charge based technologies compared with magnetic ones.

Electrophoretic deposition is a common method used to deposit a charged material onto an oppositely charged surface. Electrophoretic deposition is mainly concerned with the simple deposition of material onto a substrate, though it has been shown that anisotropic materials such as nanorods can have an ordered deposition profile and be aligned onto the surface due to an electric dipole on the particles. This ordering has been demonstrated using semiconducting CdSe nanorods and further applied for semiconductor applications such as a thin film lasers. This technique though, has not been applied to or used with photonic crystal materials.

To date, photonic crystals uses are advertised as the next generation of tunable colors and pigments, but have been used for little more than chemical, pressure, and magnetic field sensors, which have limited use in industry. Magnetic field control has enabled remote manipulation of photonic crystals. However, the engineering infrastructure needed to support magnetic applications also must be evolved in order to expand applicability of magnetic manipulation. Additional methods of controlling photonic crystal structures and their geometry is important to capitalizing on their unique color exhibiting properties and employing them across a wider range of applications for industry and consumer goods. Much of industry has evolved around electricity and electric fields. By creating photonic crystals that can be manipulated electrically, the photonic crystals can be adapted to existing industrial infrastructure to better support the use of photonic crystals in a broader set of applications.

SUMMARY OF THE INVENTION

In consideration of the above issues, it would be desirable to have a system and method for electrostatic alignment and surface assembly of photonic crystals for dynamic color exhibition.

A method is disclosed of electrostatic alignment and surface assembly of photonic crystals for dynamic color exhibition, the method comprising: dispersing a plurality of photonic crystal chains into a solution; placing the solution of the plurality of photonic crystal chains in a container (i.e., an apparatus, device, means and the like that contains or holds the solution comprising a plurality of photonic crystal chains); and assembling and aligning the plurality of photonic crystal chains in the solution by a local charge build up on a surface of the container to exhibit color.

A system is disclosed for dynamic color exhibition, the system comprising: a plurality of photonic crystal chains dispersed into a solution; a container, the container containing the plurality of photonic crystal chains in the solution; and wherein the plurality of photonic crystal chains in the solution assemble and align exhibiting color when a local charge build up is placed or located on or near a surface of the container.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1B:
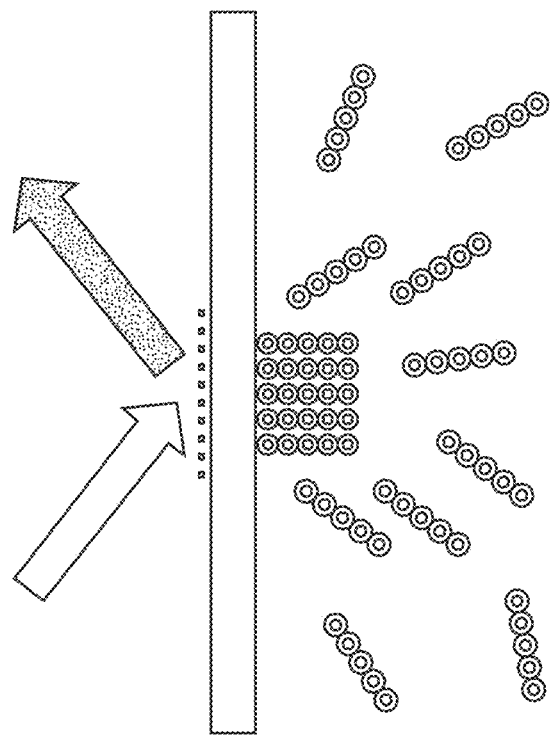
FIG. 1B is an illustration of an assembly and alignment of photonic crystal chains diffracting a specific color in the presence of a local charge build up on a surface of a container.

Reference will now be made in detail to the present preferred embodiments of the invention, examples of which are illustrated in the accompanying drawings. Wherever possible, the same reference numbers are used in the drawings and the description to refer to the same or like parts.

The disclosure consists of photonic crystals which are sensitive to electric charge on a surface such that the photonic crystals may self-assemble or align onto said surface and exhibit color. In accordance with an exemplary embodiment, hydrophobic silica coated nanomaterials retain latent charges on their surfaces when dispersed into non-polar solvents. In accordance with an exemplary embodiment, these latent charges tend to accumulate on sharp edges, in this case the ends/tips of the one-dimensional (1D) geometries of these particles which in turn create electric dipoles at those ends of the anisotropic nanomaterials. These electric dipoles on the nanoparticles impart a sensitivity to other charges or charge potentials that may be present. Hence, when an electric field is applied through solution or built up on the wall of the container, the anisotropic nanoparticles align and self-assemble in the charged region. Because these materials are photonic crystals, when aligned or self-assembled, these materials exhibit color by diffraction.

In accordance with an exemplary embodiment, this phenomenon of using photonic crystals as disclosed can be used for viewing, measuring, and sensing charge build-up on surfaces, which can be an added tool to reduce risks in industry where electrically sensitive equipment or highly flammable fuels are used and where static discharges can become dangerous. In accordance with an exemplary embodiment, the disclosure can also be employed to manipulate photonic crystals near a surface or in solution allowing for novel reflective display technologies using photonic crystals having the support of an established electronic device infrastructure.

In accordance with an exemplary embodiment, the disclosure described here uses hydrophobic photonic crystals to exhibit a color when self-assembled and aligned onto a charged surface. Specifically $Fe_3O_4$ nanoclusters are arranged into one-dimensional (1D) chains and fixed by a coating of $SiO_2$ to form a linear pea-pod like structure which is made hydrophobic by functionalizing the silica surface with octadecyltrimethoxysilane (ODTMS). Hydrophobic surface treatment can be accomplished using various other moieties, such as linear alkane silanes (beyond the exemplified octadecyl), branched alkane silanes, halogenated silanes, and other moieties known in the art. In accordance with an exemplary embodiment, control over the size and cluster spacing in the chain allows for color tuning/selection of the photonic crystal. Once hydrophobic, the photonic crystals can be dispersed in a nonpolar solvent to create an electrically sensitive photonic crystal solution. Charge control agents and additional dispersants can be added to the solution in order to tune the behavior or sensitivity of the photonic crystals to the presence of an electric field or surface charges. In accordance with an exemplary embodiment, instead of (1D) chains, anisotropic nanorods or pre-fixed 3D nanorod-based photonic crystals can also be used, which nanorods can be packaged or encapsulated in various substrates such as encapsulation or solid emulsions.

Figure 1A:
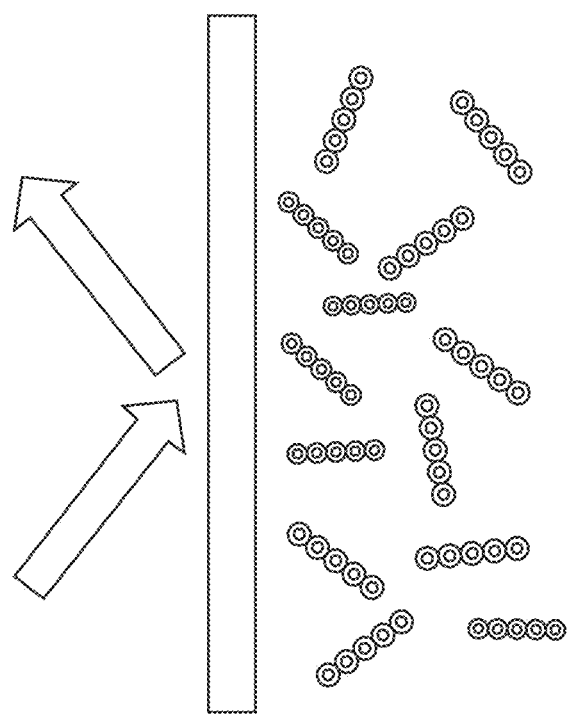
FIG. 1A is an illustration of a solution of electrically sensitive photonic crystal chains having a random distribution in accordance with an exemplary embodiment.

When in a container such as polypropylene or polycarbonate, a static charge can be built-up on the containers surface by the triboelectric effect. When static charges are deposited onto the surface, the photonic crystals in solution self-assemble and align at the charged region. When aligned, the photonic crystals display their color effectively indicating the charge distribution on the wall of the container or through solution. This mechanism is represented schematically in FIGS. 1A and 1B. FIG. 1A shows a solution of electrically sensitive photonic crystal chains having a random distribution, and FIG. 1B illustrates an assembly and alignment of photonic crystal chains diffracting a specific color in the presence of a local charge build up on the surface of the container.

Figure 2B:
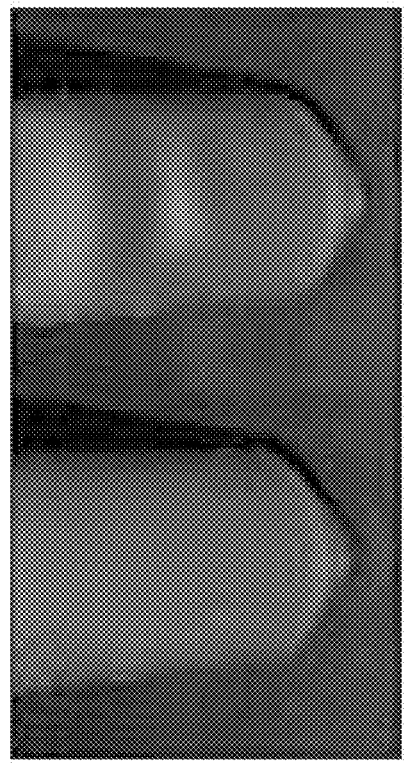
FIG. 2B is an illustration of yellow-green photonic crystal chains with a red background dye sensing a localized charge build up on the wall of a polypropylene container.
Figure 2A:
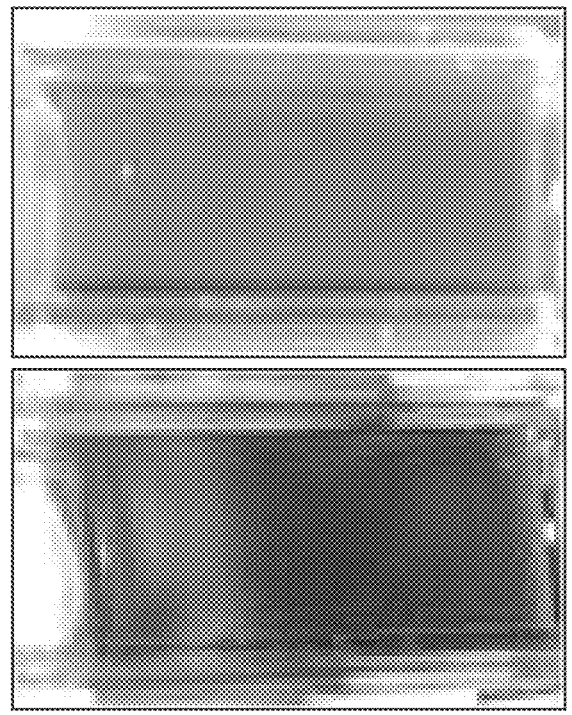
FIG. 2A is an illustrations of orange photonic crystal chains with a blue background dye in a polycarbonate cuvette, wherein the orange color is due to the assembly and alignment of the photonic chains in a region of charge build up on the containers surface from rubbing with the tip of a finger (left) and no stimuli (right).

In accordance with an exemplary embodiment, the contrast between the color of the photonic crystal being displayed in a charged region and the background can be improved by the addition of dyes or pigments. Because the photonic crystals align at the surface, the dye in solution will act as a backdrop color without attenuation or interference between the light source and the photonic crystal. FIGS. 2A and 2B show photonic crystal chains sensing the presence of a localized charge build up on the wall of their containers and having an added background dye to improve contrast of the diffraction color in the charged region.

FIG. 2A illustrates orange photonic crystal chains with a blue background dye in a polycarbonate cuvette. The orange color is due to the assembly and alignment of the photonic chains in a region of charge build up on the containers surface by rubbing with the tip of a finger. FIG. 2B illustrates yellow-green photonic crystal chains with a red background dye sensing a localized charge build up on the wall of a polypropylene container.

Methods

Silica surface of $Fe_3O_{4@}SiO_2$ photonic crystals are functionalized with octadecyltrimethoxysilane (ODTMS) by dispersing in a mixture of 12.5 mL ethanol and 0.5 mL 28-30% ammonium hydroxide solution in a sealed glass vial. 150 uL ODTMS is added while stirring and the temperature is raised to a reflux for 1.5 hours with occasional sonication. In accordance with an exemplary embodiment, the hydrophobic phonic crystals (HPCs) are magnetically separated and washed with hexanes and suspended in non-polar alkane solvents such as hexanes or paraffin oil.

In accordance with an exemplary embodiment, the present disclosure represents an ability to visualize surface charge accumulation and localization on surfaces indicated by a color change.

In accordance with an exemplary embodiment, the electrostatic sensing by photonic crystal chains, that is, surface alignment of nanochains from solution onto the surface of clear plastics or polymers (e.g., polypropylene, polycarbonate) is performed using the triboelectric effect. In accordance with an exemplary embodiment, instead of nanochains, nanorods can be used.

In accordance with an exemplary embodiment, the nanorods can be anisotropic nanorods or pre-fixed 3D nanorod based photonic crystals, which can be packaged or encapsulated in various substrates such as encapsulation or solid emulsions.

As used herein, an element or step recited in the singular and preceded by the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional examples that also incorporate the recited features.

The patent claims at the end of this document are not intended to be construed under 35 U.S.C. § 112(f) unless traditional means-plus-function language is expressly recited, such as "means for" or "step for" language being expressly recited in the claim(s).

It will be apparent to those skilled in the art that various modifications and variation can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of electrostatic alignment and surface assembly of photonic crystals for dynamic color exhibition, the method comprising:
    dispersing a plurality of photonic crystal chains into a solution, each of the plurality of photonic crystal chains includes a plurality of nanoparticles;
    placing the solution of the plurality of photonic crystal chains in a container; and
    assembling and aligning the plurality of photonic crystal chains in the solution in a region of a local charge build up on a surface of the container to exhibit color.

2. The method according to claim 1, wherein the solution is a non-polar solvent.

3. The method according to claim 1, wherein the plurality of photonic crystal chains are sensitive to an electric charge on the surface of the container such that the plurality of photonic crystal chains self-assemble or align onto the surface of the container and exhibit color.

4. The method according to claim 1, wherein the plurality of photonic crystal chains are hydrophobic silica coated nanomaterials, which retain latent charges on a surface of the hydrophobic silica coated nanomaterials when dispersed into a non-polar solvent.

5. The method according to claim 4, comprising:
    applying an electrical charge through the solution or on the surface of the container, and wherein the hydrophobic silica coated nanomaterials align and self-assemble in a region of the electrical charge and exhibit color by diffraction.

6. The method according to claim 4, further comprising:
    placing the container of the solution of the plurality of photonic crystal chains in an environment in which electrically sensitive equipment or highly flammable fuels are used and static discharges are dangerous; and
    one or more of viewing, measuring, and sensing the charge build-up on the surface of the container from a change in the color exhibited by the plurality of photonic crystal chains.

7. The method according to claim 1, further comprising:
    manipulating the plurality of photonic crystal chains near a surface or in solution allowing for reflective display technologies using photonic crystal chains having an established electronic device infrastructure.

8. The method according to claim 1, wherein the plurality of photonic crystal chains are $Fe_3O_4$ nanoclusters arranged into one-dimensional (1D) chains and fixed by a coating of $SiO_2$ to form a linear pea-pod like structure, and the method comprising:
    functionalizing the silica surface of the $Fe_3O_4$ nanoclusters arranged into the one-dimensional (1D) chains with octadecyltrimethoxysilane.

9. The method according to claim 8, further comprising:
    controlling a size and cluster spacing of the plurality of nanoparticles in each of the plurality of photonic crystal chains for color tuning.

10. The method according to claim 1, wherein once the plurality of photonic crystal chains are hydrophobic, the plurality of photonic crystal chains are dispersed in a non-polar solvent to create an electrically sensitive photonic crystal solution.

11. The method according to claim 10, further comprising:
    adding charge control agents and dispersants to the solution to tune behavior or sensitivity of the plurality to photonic crystal chains to a presence of an electric field or surface charge.

12. The method according to claim 1, wherein the container is polypropylene or polycarbonate, and a static charge is built-up on the surface of the container by a triboelectric effect.

13. The method according to claim 1, further comprising:
    adding a dye or pigment into the solution, the dye or pigment configured to act as a backdrop color without attenuation or interference between a light and the plurality of photonic crystal chains.

14. The method according to claim 13, wherein the plurality of photonic crystal chains are nanorods.

15. The method according to claim 14, wherein the nanorods are anisotropic nanorods or pre-fixed 3D nanorod based photonic crystal chains, and packaged or encapsulated in encapsulation or solid emulsions.

16. A system for dynamic color exhibition, the system comprising:
    a plurality of photonic crystal chains, each of the plurality of photonic crystal chains includes a plurality of nanoparticles;
    a container, the container containing the plurality of photonic crystal chains in a solution; and
    wherein the plurality of photonic crystal chains in the solution assemble and align exhibiting color in a region of a local charge build up located on or near a surface of the container.

17. The system according to claim 16, wherein the solution is a non-polar solvent.

18. The system according to claim 16, wherein the plurality of photonic crystal chains are sensitive to an electric charge on the surface of the container such that the plurality of photonic crystals self-assemble or align onto the surface of the container and exhibit color.

19. The system according to claim 16, wherein the plurality of photonic crystal chains are hydrophobic silica coated nanomaterials, which retain latent charges on a surface of the hydrophobic silica coated nanomaterials when dispersed into a non-polar solvent.

20. The system according to claim 19, wherein an electrical charge is applied through the solution or on the surface of the container, and wherein the hydrophobic silica coated nanomaterials align and self-assemble in a region of the electrical charge and exhibit color by diffraction.

21. The system according to claim 19, wherein the hydrophobic silica coated nanomaterials are used for one or more of viewing, measuring, and sensing charge build-up on surfaces to reduce risks in an environment where electrically sensitive equipment or highly flammable fuels are used and where static discharges are dangerous.

22. The system according to claim 16, wherein the plurality of photonic crystal chains are manipulated near a surface or in solution allowing for reflective display technologies using photonic crystal chain having an established electronic device infrastructure.

23. The system according to claim 16, wherein the plurality of photonic crystal chains are $Fe_3O_4$ nanoclusters arranged into one-dimensional (1D) chains and fixed by a coating of $SiO_2$ to form a linear pea-pod like structure, and the wherein the silica surface of the $Fe_3O_4$ nanoclusters arranged into the one-dimensional (1D) chains are functionalized with octadecyltrimethoxysilane.

24. The system according to claim 23, wherein a size and cluster spacing of the plurality of nanoparticles for the plurality of photonic crystal chains are controlled for color tuning.

25. The system according to claim 16, wherein once the plurality of photonic crystal chains are hydrophobic, the plurality of photonic crystal chains are dispersed in a non-polar solvent to create an electrically sensitive photonic crystal solution.

26. The system according to claim 25, wherein charge control agents and dispersants are added to the solution to tune behavior or sensitivity of the plurality to photonic crystal chains to a presence of an electric field or surface charge.

27. The system according to claim 16, wherein the container is polypropylene or polycarbonate, and a static charge is built-up on the surface of the container by a triboelectric effect.

28. The system according to claim 16, wherein a dye or pigment is added into the solution, the dye or pigment configured to act as a backdrop color without attenuation or interference between a light and the plurality of photonic crystal chains.

29. The system according to claim 28, wherein the plurality of photonic crystal chains are nanorods.

30. The system according to claim 29, wherein the nanorods are anisotropic nanorods or pre-fixed 3D nanorod based photonic crystals, and packaged or encapsulated in encapsulation or solid emulsions.

* * * * *